(12) United States Patent
Hasegawa

(10) Patent No.: US 11,217,759 B2
(45) Date of Patent: Jan. 4, 2022

(54) DISPLAY DEVICE AND METHOD OF MANUFACTURING DISPLAY DEVICE

(71) Applicant: JOLED INC., Tokyo (JP)

(72) Inventor: Eiji Hasegawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/890,330

(22) Filed: Jun. 2, 2020

(65) Prior Publication Data
US 2020/0388777 A1    Dec. 10, 2020

(30) Foreign Application Priority Data
Jun. 5, 2019   (JP) .............................. JP2019-105338

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01)

(58) Field of Classification Search
None
See application file for complete search history.

(56) References Cited

U.S. PATENT DOCUMENTS

2016/0028012 A1*   1/2016   Cheng ................. H01L 27/1218
                                                       438/23
2018/0123059 A1*   5/2018   Yang ...................... H01L 51/56

FOREIGN PATENT DOCUMENTS

JP           2003-076297 A        3/2003

* cited by examiner

*Primary Examiner* — J. E. Schoenholtz
(74) *Attorney, Agent, or Firm* — Greenblum & Bernstein, P.L.C.

(57) ABSTRACT

A display device includes a flexible substrate, a self-luminescent element, and a support member. The flexible substrate has a first face and a second face opposed to the first face. The self-luminescent element is provided on the first face of the flexible substrate. The support member includes a magnetic material and is provided on the second face of the flexible substrate.

15 Claims, 9 Drawing Sheets

DISPLAY DEVICE AND METHOD OF MANUFACTURING DISPLAY DEVICE

CROSS REFERENCE TO RELATED APPLICATIONS

This application claims the benefit of Japanese Priority Patent Application No. 2019-105338 filed on Jun. 5, 2019, the entire contents of which are incorporated herein by reference.

BACKGROUND

The technology relates to a display device including a flexible substrate and a method of manufacturing the display device.

Bendable display devices, so-called flexible displays, have been developed. Flexible displays include a flexible substrate, for example. Reference is made to Japanese Unexamined Patent Application Publication No. 2003-76297, for example.

SUMMARY

A display device according to one embodiment of the disclosure includes a flexible substrate, a self-luminescent element, and a support member. The flexible substrate has a first face and a second face opposed to the first face. The self-luminescent element is provided on the first face of the flexible substrate. The support member includes a magnetic material and is provided on the second face of the flexible substrate.

A method of manufacturing a display device according to one embodiment of the disclosure includes: attaching a first support member to a second face of a flexible substrate; forming a self-luminescent element on a first face of the flexible substrate, the first face being opposed to the second face of the flexible substrate to which the first support member is attached; removing the first support member from the flexible substrate after the forming of the self-luminescent element; and attaching a second support member including a magnetic material to the second face of the flexible substrate after the removing of the first support member.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

A flexible substrate of a display device is likely to warp during the manufacture of the display device. The warpage of the flexible substrate can affect the manufacturing stability.

It is desirable to provide a display device and a method of manufacturing the display device having a flexible substrate resistant to warpage and thus having higher manufacturing stability.

Some example embodiments of the technology will now be described with reference to the accompanying drawings. Note that the description is given in the following order.
1. Embodiments (Example Display Device Provided with Magnetic Support Member on Rear Surface of Substrate)
2. Exemplary Configuration of Display Device
3. Example Imaging Apparatus
4. Example Electronic Apparatus

EMBODIMENT

[Exemplary Configuration of Display Device 1]

Figure 1:
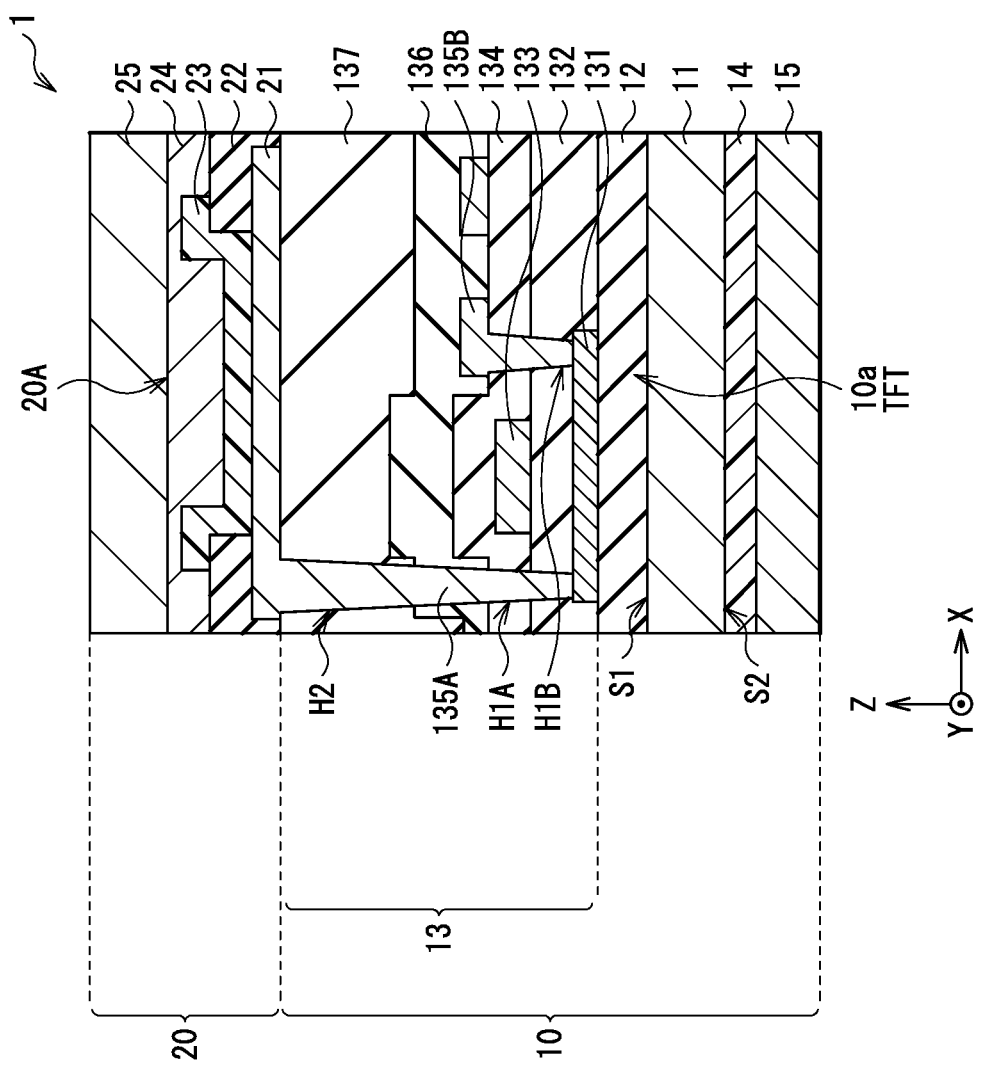
FIG. 1 is a schematic cross-sectional view of a display device having an exemplary configuration according to one example embodiment of the technology.

FIG. 1 illustrates an exemplary schematic cross-sectional configuration of a display device 1 according to an example embodiment of the technology. The display device 1 may be an organic electroluminescent (EL) device, for example. The display device 1 may include a semiconductor device 10 and a display device layer 20 provided on the semiconductor device 10. For example, the display device 1 may be a top-emission display device that emits light through the top face opposite to the face adjacent to the semiconductor device. The semiconductor device 10 may include a plurality of thin film transistors (TFTs) 10a. The display device layer 20 may include a plurality of organic electroluminescent elements 20A. In FIG. 1, one of the TFTs 10a and one of the organic electroluminescent elements 20A are illustrated.

The semiconductor device 10 may include, in order, an under coat (UC) film 12 and a TFT layer 13 on a front surface S1 of a substrate 11, for example. In one embodiment, the front surface S1 corresponds to a specific but non-limiting example of a "first face". The TFT 10a may be provided in the TFT layer 13. The substrate 11 has a rear surface S2 opposed to the front surface S1. In one embodiment, the rear surface S2 corresponds to a specific but non-limiting example of a "second face". A magnetic support member 15 is attached to the rear surface S2 of the substrate 11. In one example, the magnetic support member 15 may be attached to the rear surface S2 of the substrate 11 via an adhesive layer 14.

The substrate 11 may be a flexible substrate, for example. The substrate 11 may include a resin material, and have a thickness of 3 μm to 60 μm along the Z-direction illustrated in FIG. 1, for example. Specific but non-limiting examples of the resin material of the substrate 11 may include polyethylene terephthalate (PET), polyimide (PI), polycarbonate (PC), polyamide, polyethersulfone (PES), and polyethylene naphthalate (PEN). In one example, PI may be included in the substrate 11 to improve the thermal resistance of the substrate 11, which allows the TFT layer 13 to be produced at a higher processing temperature.

The UC film 12 may prevent sodium ions or other substances from mitigating from the substrate 11 to upper layers. The UC film 12 may include an insulating material, such as silicon nitride (SiN) or silicon oxide (SiO). For example, the UC film 12 may be a laminated film including a silicon nitride (SiN) film and a silicon oxide (SiO) film in this order from the substrate 11. The UC film 12 may extend over the entire surface of the substrate 11.

The TFT 10a in the TFT layer 13 may be a top-gate thin-film transistor, for example. The TFT 10a may include a semiconductor layer 131 in a selective region on the UC film 12. A gate insulating film 132 may be provided on the semiconductor layer 131, and a gate electrode 133 may be provided on the gate insulating film 132. An interlayer insulating film 134 may be provided so as to cover the gate electrode 133. Contact holes H1A and H1B may be provided through the interlayer insulating film 134 and the gate insulating film 132 so as to be opposed to a portion of the semiconductor layer 131. Paired source-drain electrodes 135A and 135B may be provided on the interlayer insulating film 134 so as to fill the respective contact holes H1A and H1B. The interlayer insulating film 134 and the source-drain electrodes 135A and 135B may be covered with a passivation film 136. A planarization film 137 may be provided between the passivation film 136 and a first electrode 21 of the display device layer 20 described below. In one embodiment, the TFT 10a corresponds to a specific but non-limiting example of a "transistor".

The semiconductor layer 131 may be formed on the UC film 12 by patterning. The semiconductor layer 131 may include a channel region (active layer) in a region opposed to the gate electrode 133. The semiconductor layer 131 may include an oxide semiconductor including an oxide of one or more elements of indium (In), gallium (Ga), zinc (Zn), tin (Sn), titanium (Ti), and niobium (Nb), for example. Specific but non-limiting examples of the material of the semiconductor layer 131 may include indium tin zinc oxide (ITZO), indium gallium zinc oxide (IGZO: InGaZnO), zinc oxide (ZnO), indium zinc oxide (IZO), indium gallium oxide (IGO), indium tin oxide (ITO), and indium oxide (InO). Alternatively, the semiconductor layer 131 may include low-temperature polycrystalline silicon (LTPS) or amorphous silicon (a-Si), for example.

The gate insulating film 132 may be a single-layer film including, for example, one of silicon oxide ($SiO_x$), silicon nitride ($SiN_x$), silicon nitride oxide (SiON), and aluminum oxide ($AlO_x$). Alternatively, the gate insulating film 132 may be a multi-layer film including two or more thereof. The gate insulating film 132 may extend over the entire surface of the substrate 11 so as to cover the semiconductor layer 131, for example. The gate insulating film 132 may be provided on the channel region of the semiconductor layer 131. The gate insulating film 132 may have a planar shape the same as that of the gate electrode 133.

The gate electrode 133 may control the carrier density of the semiconductor layer 131 on the basis of a gate voltage (Vg) applied thereto, and may serve as a wiring line that supplies an electric potential. The gate electrode 133 may include a metal that includes one of titanium (Ti), tungsten (W), tantalum (Ta), aluminum (Al), molybdenum (Mo), silver (Ag), neodymium (Nd), and copper (Cu). Alternatively, the gate electrode 133 may include an alloy that includes two or more thereof. Still alternatively, the gate electrode 133 may be a compound that includes one or more of these components or a laminated film that includes two or more of these components. Still alternatively, the gate electrode 133 may be a transparent electrically-conductive film that includes ITO, for example.

The interlayer insulating film 134 may include an organic material, such as acrylic resin, polyimide (PI), or novolak resin. Alternatively, the interlayer insulating film 134 may include an inorganic material, such as silicon oxide, silicon nitride, silicon nitride oxide, or aluminum oxide.

The source-drain electrodes 135A and 135B may serve as a source and a drain of the TFT 10a. For example, the source-drain electrodes 135A and 135B may include a metal or a transparent electrically-conductive film similar to those listed above as the material of the gate electrode 133. In one example, the source-drain electrodes 135A and 135B may include a material having high electrical conductivity. For example, the source-drain electrode 135A may serve as the source of the TFT 10a, and the source-drain electrode 135B may serve as the drain of the TFT 10a. In this case, the source-drain electrode 135A may be supplied with a source potential PS, and the source-drain electrode 135B may be supplied with a drain potential PD.

The passivation film 136 may be provided on the interlayer insulating film 134 so as to cover the source-drain electrodes 135A and 135B. The passivation film 136 may include silicon oxide (SiO) or silicon nitride (SiN), for example. The planarization film 137 may cover the TFT 10a with the passivation film 136 provided therebetween.

The display device layer 20 provided on the planarization film 137 may include multiple pixels (pixels pr, pg, and pb illustrated in FIG. 2 described below) and an organic electroluminescent element 20A. In one embodiment, the organic electroluminescent element 20A corresponds to a specific but non-limiting example of a "self-luminescent element". The organic electroluminescent elements 20A may be driven by a backplane including the TFT 10a to display an image. The organic electroluminescent element 20A may include a first electrode 21, an organic layer 23 including a light-emitting layer, and a second electrode 24 in this order from the TFT layer 13. The first electrode 21 may serve as an anode, for example. The first electrode 21 may be coupled to the source-drain electrode 135A of the TFT 10a. The second electrode 24 may serve as a cathode, for example. The second electrode 24 may supply a common cathode potential to each of the pixels through a common potential line (cathode line), for example. The first electrode 21 and the organic layer 23A may be separated by a barrier layer 22. The second electrode 24 may be covered with a protective film 25. The organic electroluminescent element 20A may be sealed between the substrate 11 and a non-illustrated sealing substrate, for example.

The first electrode 21 may be provided on a selective region of the planarization film 137 for each pixel, for example. The first electrode 21 may be an electrode that injects holes to the light-emitting layer in the organic layer 23, for example. The first electrode 21 may include an electrically conductive material having light reflectivity, for example. Examples of the material of the first electrode 21 may include a metal, such as silver (Ag) or aluminum (Al), or an alloy thereof. The first electrode 21 may be electrically coupled to the source-drain electrode 135A via a contact hole H2 provided in the planarization film 137 and the passivation film 136.

The barrier layer 22 may be provided between the first electrodes 21 adjacent to each other. The barrier layer 22 may cover an end portion of the first electrode 21. The barrier layer 22 may electrically separate the first electrodes 21 provided for the respective pixels and serve to ensure insulation between the first electrode 21 and the second electrode 24. The barrier layer 22 may include acrylic resin or polyimide resin, for example.

The organic layer 23 provided between the first electrode 21 and the second electrode 24 may include a light-emitting layer that includes an organic compound. The organic layer 23 may include a red-light-emitting layer, a green-light-emitting layer, and a blue-light-emitting layer, for each pixel, for example. The light-emitting layer may emit light by generating excitons through recombination of electrons and holes injected through the first electrode 21 and the second electrode 24. Optionally, the organic layer 23 may include a hole transport layer and a hole injection layer between the light-emitting layer and the first electrode 21, and/or may include an electron transport layer and an electron injection layer between the light-emitting layer and the second electrode 24.

The second electrode 24 may face the first electrode 21 across the organic layer 23. The second electrode 24 may extend over the entire surface of a pixel unit 2 (described below with reference to FIGS. 2A and 2B) and serve as a common electrode for the pixels. For example, the second electrode 24 may serve as an electrode that injects electrons to the light-emitting layer of the organic layer 23. The second electrode 24 may include an optically-transparent electrically-conductive material, for example. The second electrode 24 may be a transparent electrically-conductive film including indium tin oxide (ITO), indium zinc oxide (IZO), or indium gallium zinc oxide (IGZO), for example.

The protective film 25 covering the second electrode 24 may include an inorganic material, such as silicon nitride or silicon oxide.

In an example embodiment, the magnetic support member 15 is attached to the rear surface S2 of the substrate 11. In one example, the magnetic support member 15 may be attached to the rear surface S2 of the substrate 11 via the adhesive layer 14. The magnetic support member 15 includes a magnetic material. The substrate 11 and the magnetic support member 15 may be drawn by a substrate holder generating a magnetic field (e.g., a substrate holder 18 described below with reference to FIG. 5E), which is described in detail below. The substrate 11 may be thereby fixed on the substrate holder while being stretched without warpage. This helps to suppress the warpage of the substrate 11 during the manufacturing process.

Figure 2A:
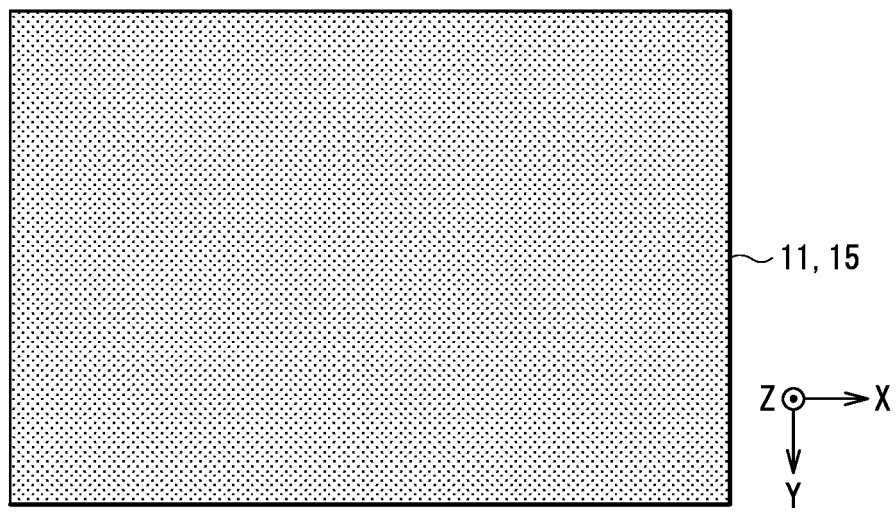
FIG. 2A is a schematic diagram illustrating an exemplary planar configuration of a substrate and a magnetic support member illustrated in FIG. 1.

FIG. 2A illustrates an exemplary planar configuration of the substrate 11 and the magnetic support member 15. The magnetic support member 15 may be a film having a planar shape substantially the same as that of the substrate 11. The magnetic support member 15 may be attached to the rear surface S2 of the substrate 11 so as to entirely extend over the rear surface S2. The magnetic support member 15 includes a magnetic material. Examples of the magnetic material of the magnetic support member 15 may include ferrite-based stainless steel and martensite-based stainless steel. In one example, the magnetic support member 15 may be a heat-dissipative member to suppress an increase in the temperature at the front surface S1 of the substrate 11. The magnetic support member 15 including a metal material may serve as a highly heat-dissipative member. In another example illustrated in FIG. 2B described below, the magnetic support member 15 may partially cover the rear surface S2 of the substrate 11. However, entirely covering the rear surface S2 of the substrate 11 with the magnetic support member 15 may enhance the heat dissipation effect. Additionally, the magnetic support member 15 may serve to protect or reinforce the substrate 11. The magnetic support member 15 may have a thickness of about 5 µm to about 150 µm, for example. The thickness of the magnetic support member 15 may be adjusted to control a magnetic force that suppresses a deformation, such as warpage or distortion, of the substrate 11.

Figure 2B:
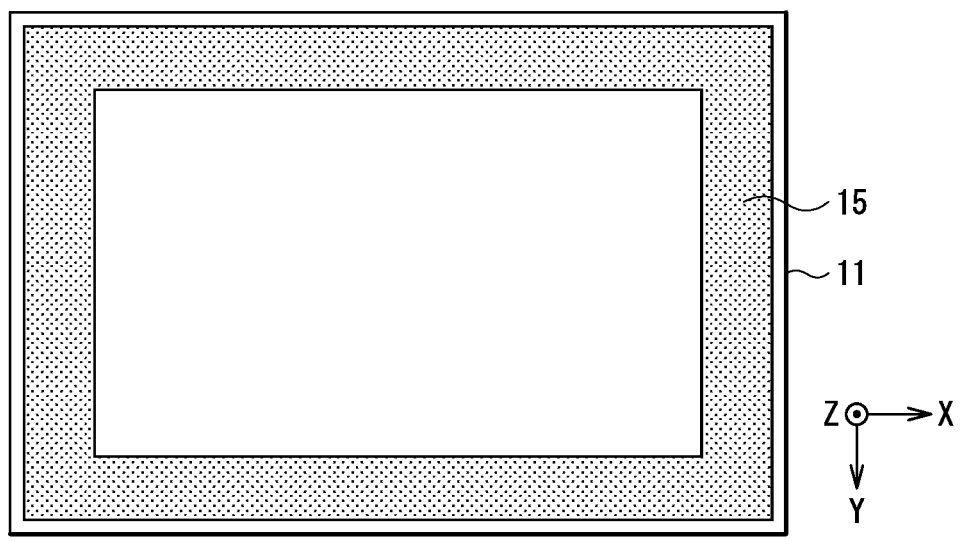
FIG. 2B is a schematic diagram illustrating another exemplary planar configuration of the substrate and the magnetic support member illustrated in FIG. 2A.

FIG. 2B illustrates another exemplary planar configuration of the substrate 11 and the magnetic support member 15. As illustrated in FIG. 2B, the magnetic support member 15 may partially cover the rear surface S2 of the substrate 11. For example, the magnetic support member 15 may be provided at least along the ends of the rear surface S2 of the substrate 11 to effectively suppress the warpage of the substrate 11. In the example illustrated in FIG. 2B, the magnetic support member 15 may be provided near the ends of the rear surface S2 and have a frame shape.

The adhesive layer 14 provided between the magnetic support member 15 and the substrate 11 may include a resin material, such as acrylic or urethane. Alternatively, the magnetic support member 15 may be attached to the substrate 11 with a viscous layer instead of the adhesive layer 14.

Figure 3:
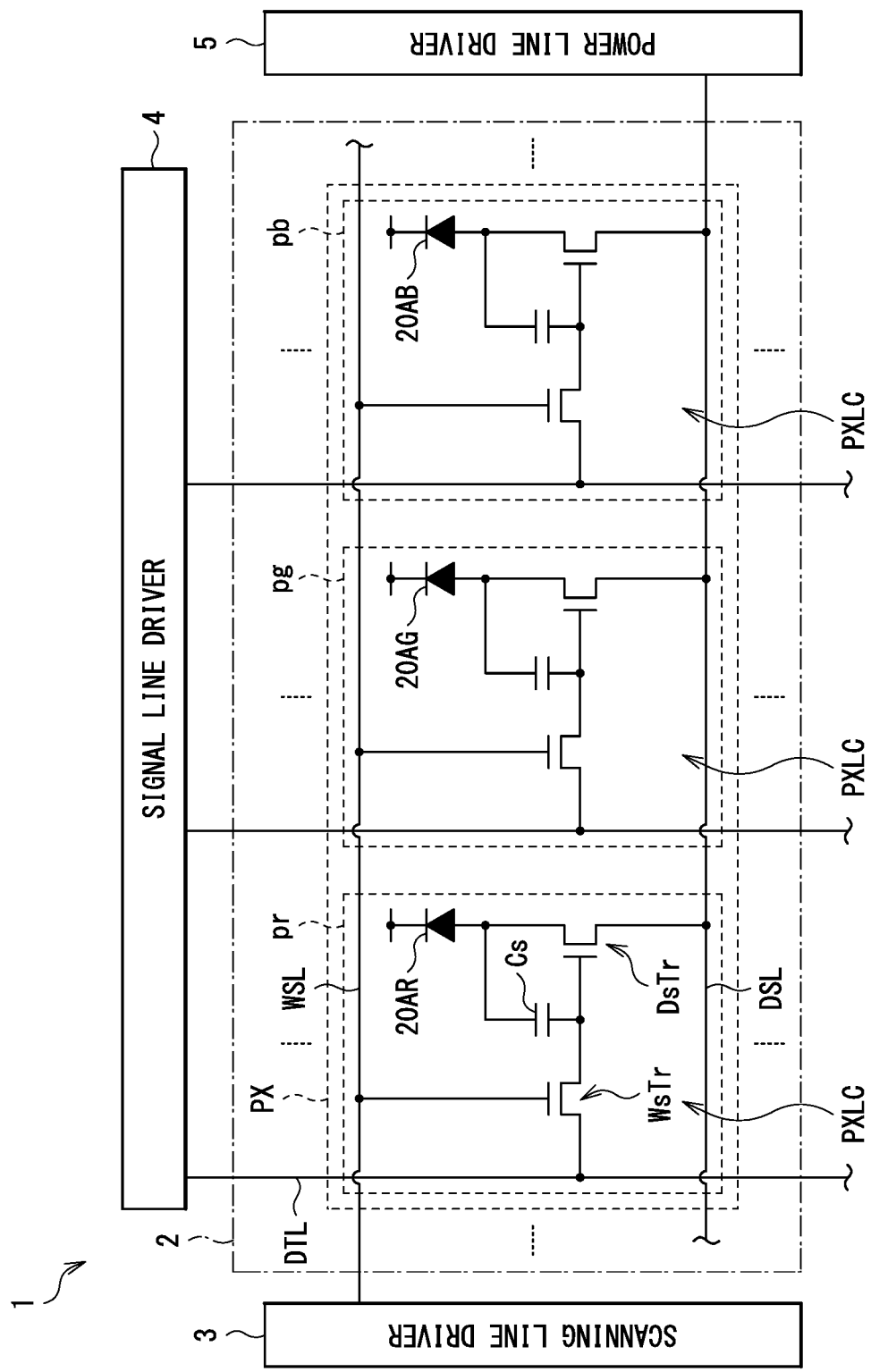
FIG. 3 is a block diagram illustrating an exemplary overall configuration of the display device illustrated in FIG. 1.

FIG. 3 is a block diagram illustrating an exemplary overall configuration of the display device 1. The display device 1 may include a pixel unit 2 and circuits that drive the pixel unit 2. The pixel unit 2 may include multiple pixels including pixels pr, pg, and pb arranged in two-dimensional arrays. The circuits may include a scanning line driver 3, a signal line driver 4, and a power line driver 5. The pixels pr, the pixels pg, and the pixels pb of the display device 1 may respectively emit red light, green light, and blue light.

The pixel unit 2 may display an image on the basis of external image signals using an active matrix scheme, for example. The pixel unit 2 may include a plurality of scanning lines WSL extending along the row direction of the pixel arrays, a plurality of signal lines DTL extending along the column direction of the pixel arrays, and a plurality of power lines DSL extending along the row direction of the pixel arrays. The scanning lines WSL, the signal lines DTL, and the power lines DSL may be electrically coupled to the pixels pr, pg, and pb. The pixels pr, pg, and pb may each correspond to a subpixel, for example. The combination of the pixels pr, pg, and pb may serve as a single pixel PX.

The pixels pr may each include an organic electroluminescent element 20AR emitting red light, for example. The pixels pg may each include an organic electroluminescent element 20AG emitting green light, for example. The pixels pb may each include an organic electroluminescent element 20AB emitting blue light, for example. The pixels pr, pg, and pb may be hereinafter collectively referred to as pixels P unless otherwise necessary to distinguish them from one another. Additionally, the organic electroluminescent elements 20AR, 20AG, and 20AB may be hereinafter collectively referred to as organic electroluminescent elements 20A unless otherwise necessary to distinguish them from one another.

The scanning lines WSL may each supply a selection pulse to the pixels P arranged in a pixel array in the pixel unit 2 to select the pixel array. The scanning lines WSL may each be coupled to a non-illustrated output terminal of the scanning line driver 3 and a gate electrode of a switching transistor WsTr described below. The signal lines DTL may supply a signal pulse based on an image signal (e.g., a signal potential Vsig and a reference potential Vofs) to each pixel P. The signal lines DTL may each be coupled to a non-illustrated output terminal of the signal line driver 4 and a source electrode of the switching transistor WsTr described below. The power lines DSL may supply a fixed potential (Vcc) as electric power to each pixel P. The power lines DSL may each be coupled to a non-illustrated output terminal of the power line driver 5 and a drain electrode of a driving transistor DsTr described below. The cathode (second electrode 24) of the organic electroluminescent element 20A may be coupled to the common potential line (cathode line).

The scanning line driver 3 may output a predetermined selection pulse to the scanning lines WSL in a linear sequential order to cause each pixel P to perform various operations including, for example, anode resetting, Vth correction, writing of the signal potential Vsig, mobility compensation, and light emission at a predetermined timing. The signal line driver 4 may generate an analog image signal corresponding to a digital image signal received from an external device, and may output the analog image signal to each of the signal lines DTL. The power line driver 5 may output a constant potential to each of the power lines DSL. These scanning line driver 3, the signal line driver 4, and the power line driver 5 may be controlled on the basis of timing control signals outputted from a non-illustrated timing controller to operate in cooperation with each other. External digital image signals may be corrected by a non-illustrated image signal receiver and then sent to the signal line driver 4.

The semiconductor device 10 may include pixel circuits PXLC that drive the respective organic electroluminescent elements 20A. The pixel circuits PXLC may control the light emission and light extinction of the respective organic electroluminescent elements 20A. For example, the pixel circuits PXLC may each include a single organic electroluminescent element 20A (i.e., any one of the organic electroluminescent elements 20AR, 20AG, and 20AB), a storage capacitor Cs, the switching transistor WsTr, and the driving transistor DsTr.

The switching transistor WsTr may control the application of an image signal (signal voltage) to the gate electrode of the driving transistor DsTr. For example, the switching transistor WsTr may perform sampling of the voltage of the signal line DTL (signal voltage) on the basis of a voltage applied to the scanning line WSL, and write the sampled signal voltage in the gate electrode of the driving transistor DsTr. The driving transistor DsTr may be coupled in series to the organic electroluminescent element 20A, and control a current flowing in the organic electroluminescent element 20A on the basis of the magnitude of the signal voltage sampled by the switching transistor WsTr. The driving transistor DsTr and the switching transistor WsTr may be an n-channel MOS thin-film transistor or a p-channel MOS thin-film transistor. The driving transistor DsTr and the switching transistor WsTr may be a single-gate transistor or a dual-gate transistor. The storage capacitor Cs may hold a predetermined voltage between the gate electrode and the source electrode of the driving transistor DsTr.

The gate electrode of the switching transistor WsTr may be coupled to the scanning line WSL. One of the source electrode and the drain electrode of the switching transistor WsTr may be coupled to the signal line DTL, and the other may be coupled to the gate electrode of the driving transistor DsTr. One of the source electrode and the drain electrode of the driving transistor DsTr may be coupled to the power line DSL, and the other may be coupled to the anode (e.g., the first electrode 21 illustrated in FIG. 1) of the organic electroluminescent element 20A. The storage capacitor Cs may be disposed between the gate electrode of the driving transistor DsTr and an electrode adjacent to the organic electroluminescent element 20A.

The TFT 10a, which is not illustrated in FIG. 3, may serve as the driving transistor DsTr, for example. Alternatively, the TFT 10a may serve as the switching transistor WsTr.

In the example embodiments described above, the pixel circuit PXLC may have a 2Tr1C circuit configuration. However, the pixel circuit PXLC may have another circuit configuration other than the 2Tr1C circuit configuration. The pixel circuit PXLC may include the 2Tr1C circuit configuration and an additional capacitor and/or an additional transistor, for example.

[Method of Manufacturing Display Device 1]

Figure 4:
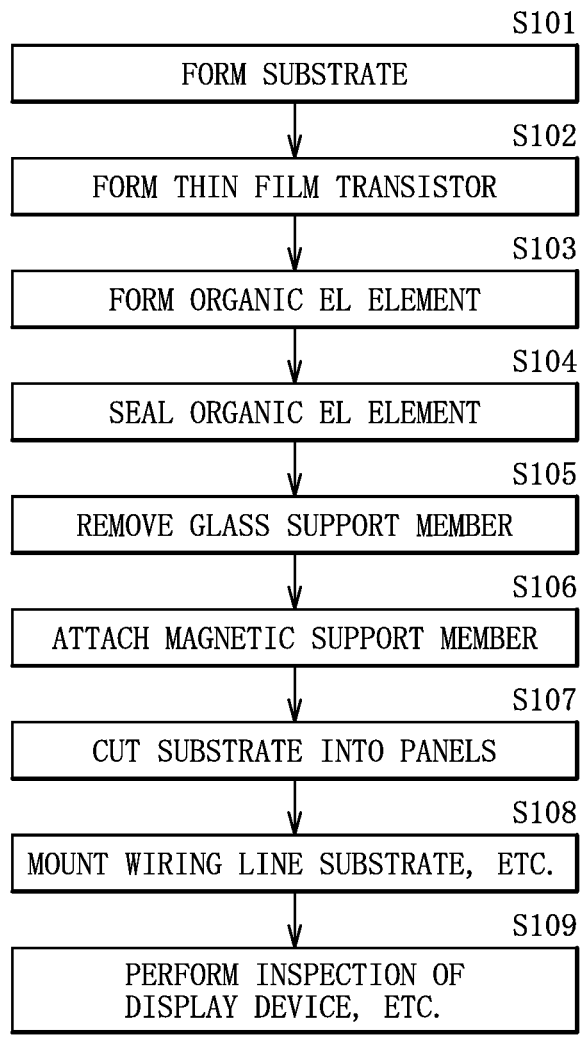
FIG. 4 is a flowchart illustrating an exemplary method of manufacturing the display device illustrated in FIG. 1.

A method of manufacturing the display device 1 will now be described with reference to FIGS. 4 and 5A to 5E. FIG. 4 is a flowchart illustrating the method of manufacturing the display device 1. FIG. 5A to FIG. 5E are schematic cross-sectional diagrams illustrating the processes illustrated in FIG. 4.

Figure 5A:
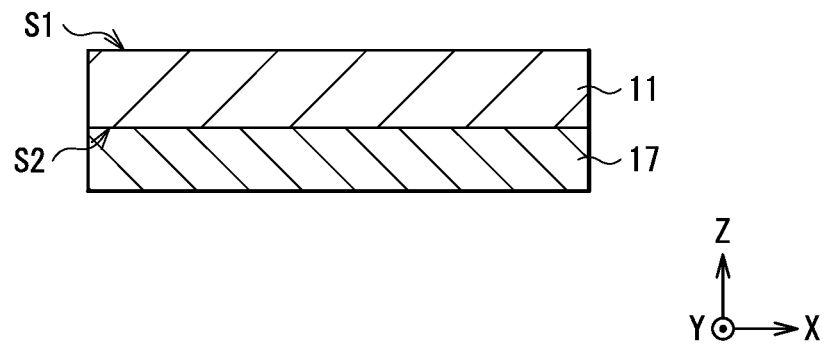
FIG. 5A is a cross-sectional diagram illustrating one of the processes in the method of manufacturing the display device illustrated in FIG. 4.

First, with reference to FIG. 5A, the substrate 11 is formed on a main face of a glass support member 17 (Step S101 in FIG. 4). In one embodiment, the glass support member 17 corresponds to a specific but non-limiting example of a "first support member". The substrate 11 may be formed by applying polyimide or a polyimide precursor composition to the main face of the glass support member 17, and then heating the applied material, for example. The glass support member 17 may be a glass plate, for example. The glass support member 17 may support the rear surface S2 of the substrate 11.

Figure 5B:
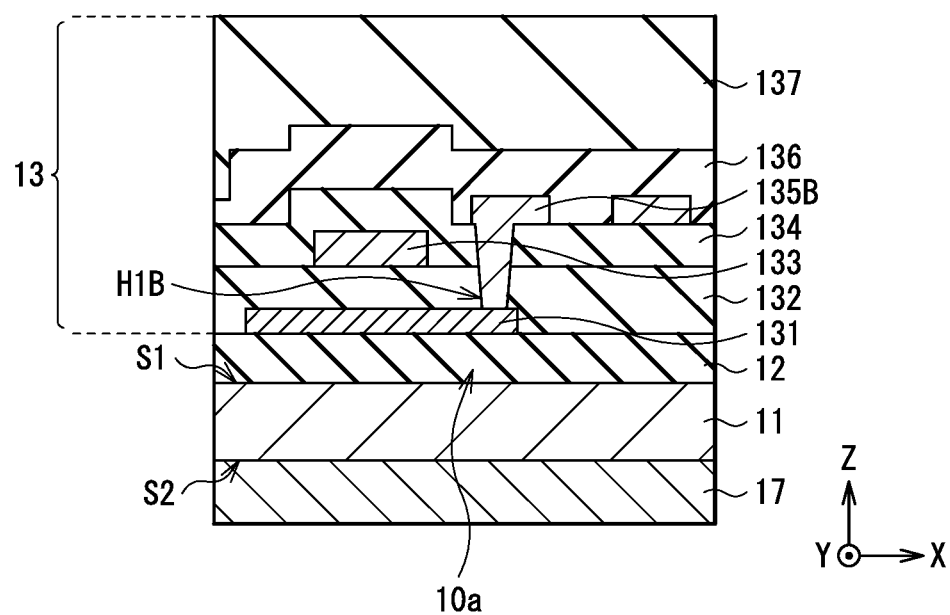
FIG. 5B is a cross-sectional diagram illustrating a process subsequent to the process illustrated in FIG. 5A.
Figure 5C:
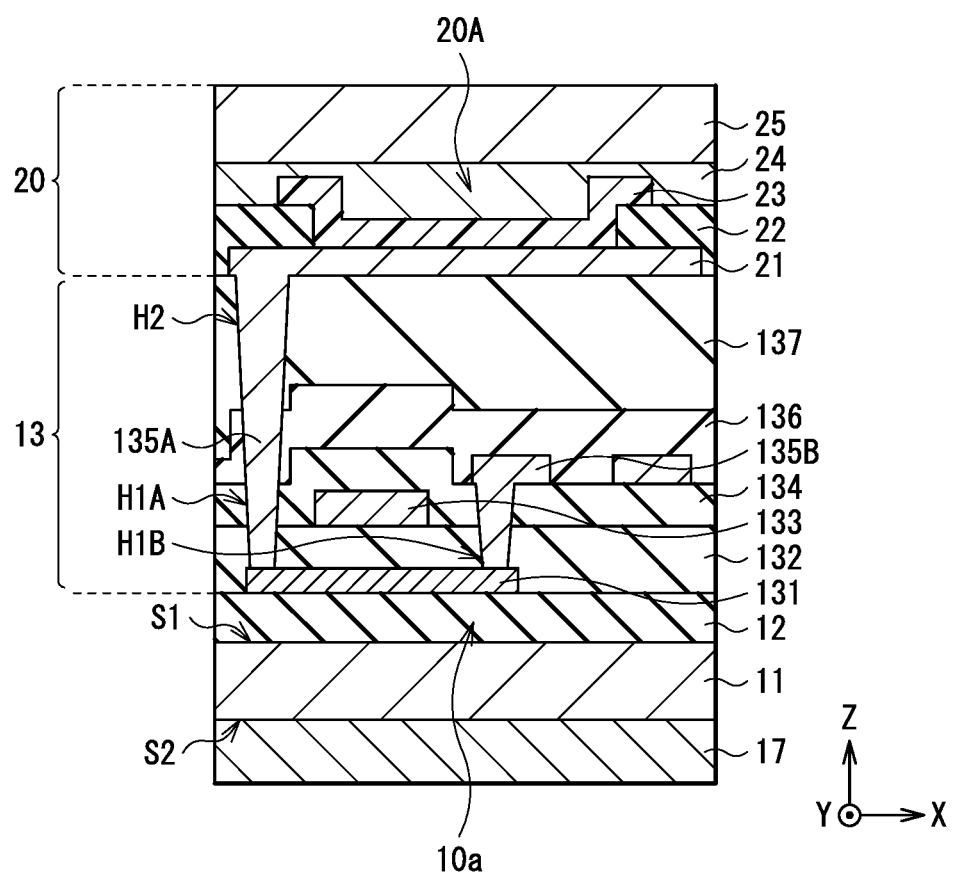
FIG. 5C is a cross-sectional diagram illustrating a process subsequent to the process illustrated in FIG. 5 B.

After forming the substrate 11 on the glass support member 17, the TFT layer 13 (TFT 10a) may be formed on the front surface S1 of the substrate 11, as illustrated in FIG. 5B (Step S102 in FIG. 4). Thereafter, as illustrated in FIG. 5C, the display device layer 20 (the organic electroluminescent element 20A) is formed, for example, on the TFT layer 13 (Step S103 in FIG. 4). Thereafter, the organic electroluminescent element 20A may be sealed with a sealing substrate (Step S104 in FIG. 4).

Figure 5D:
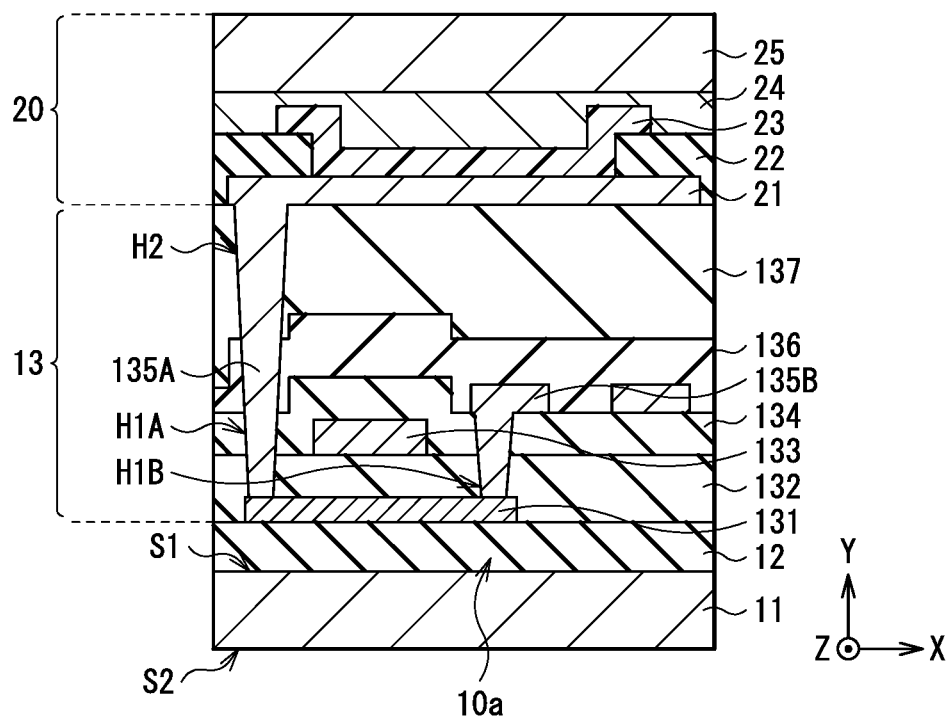
FIG. 5D is a cross-sectional diagram illustrating a process subsequent to the process illustrated in FIG. 5C.

Thereafter, as illustrated in FIG. 5D, the glass support member 17 is removed from the rear surface S2 of the substrate 11 (Step S105 in FIG. 4). The glass support member 17 may be removed by laser irradiation, for example. After removing the glass support member 17 from the rear surface S2 of the substrate 11, the adhesive layer 14 may be formed on the rear surface S2 of the substrate 11. The magnetic support member 15 is attached to, for example, the adhesive layer 14 (Step S106 in FIG. 4). In one embodiment, the magnetic support member 15 corresponds to a specific but non-limiting example of a "second support member". Thereafter, the substrate 11 may be cut into some panels (Step S107 in FIG. 4). Alternatively, the glass support member 17 may be removed after cutting the substrate 11 into some panels, followed by attaching the magnetic support member 15.

After cutting the substrate 11, a wiring line substrate and other components may be mounted on the semiconductor device 10 (Step S108 in FIG. 4), and an inspection of the display state may be performed (Step S109 in FIG. 4), for example. The display device 1 may be thereby produced. After the inspection, the magnetic support member 15 may be removed from the rear surface S2 of the substrate 11.

Figure 5E:
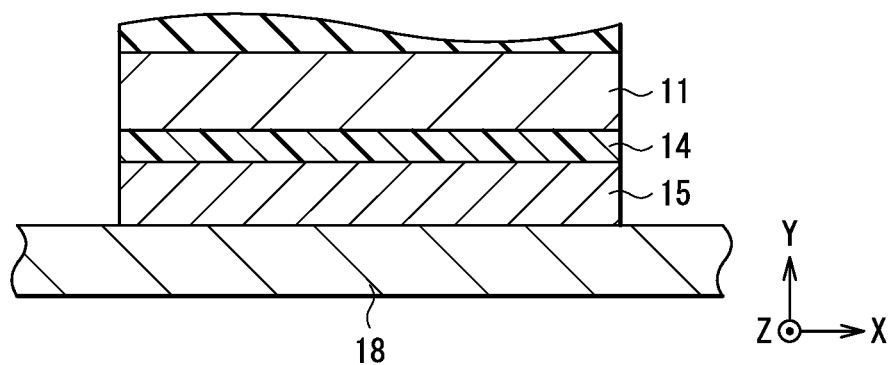
FIG. 5E is a cross-sectional diagram illustrating a process subsequent to the process illustrated in FIG. 5D.

The mounting process and the inspection process may be performed while the substrate 11 to which the magnetic support member 15 is attached is placed on the substrate holder 18, as illustrated in FIG. 5E, for example. The substrate holder 18 may be a tray to be carried between the processes or a mounting stage, for example. The substrate holder 18 may have a thickness and strength enough to keep the display device 1 flat even if the display device 1 having been warped is placed on the substrate holder 18. The substrate holder 18 may include stainless steel and have a thickness of about 5 mm, for example. The face of the substrate holder 18 on which the display device 1 is fixed may be substantially flat. The substrate holder 18 may be configured to generate a magnetic field. For example, the substrate holder 18 may generate a magnetic field when a switch is turned on, and may stop generating a magnetic field when the switch is turned off. The substrate holder 18 generating a magnetic field may draw the magnetic support member 15 and the substrate 11, and the substrate 11 may be thereby fixed on the substrate holder 18. While being fixed on the magnetic support member 15, the substrate 11 and the magnetic support member 15 may be stretched flat along the flat surface of the substrate holder 18. This suppresses the occurrence of the warpage of the substrate 11. Even if the substrate 11 is warped during the manufacturing process, the warped substrate 11 and the magnetic support member 15 may be placed on the substrate holder 18 generating a magnetic field to stretch the substrate 11. Thereafter, the substrate 11 and the magnetic support member 15 may be removed from the substrate holder 18 after turning off the switch of the substrate holder 18.

[Example Workings and Effects]

In some example embodiments of the technology, the display device 1 may cause the pixels pr, pg, and pb of the display device layer 20 to display an image based on external image signals. The light generated in the organic layer 23 may be emitted through the second electrode 24 and the protective film 25, for example. In this case, the TFT 10a may be voltage-driven for each of the pixels pr, pg, and pb in the TFT layer 13 of the semiconductor device 10, for example. In one example, when a voltage equal to a threshold voltage or greater is applied to the gate electrode 133 of the TFT 10a of any one of the pixels pr, pg, and pb, the semiconductor layer 131 may be activated (a channel may be formed), generating a current flowing between the paired source-drain electrodes 135A and 135B.

In at least one example embodiment of the technology, the magnetic support member 15 is attached to the rear surface S2 of the substrate 11. The magnetic support member 15 and the substrate 11 may be drawn by a magnetic field, suppressing the warpage of the substrate 11 during the manufacturing process. This workings and effects will now be described.

For example, it is conceivable to attach a metal plate including copper (Cu) or another metal to the rear surface S2 of the substrate 11 after the cutting process (Step S107 in FIG. 4) to release heat from the substrate 11. However, the metal plate and the substrate 11 are likely to be warped during the mounting process (Step S108 in FIG. 4) or the inspection process (Step S109 in FIG. 4) after the cutting process of the substrate 11. This requires great attention to handle the substrate 11. The deformation, such as warpage or distortion, of the substrate 11 can affect the quality, cost, and manufacturing yield of the display device 1, for example. This can be a hindrance to stable manufacturing of the display device 1.

In contrast, in at least one of example embodiment of the technology, the magnetic support member 15 attached to the rear surface S2 of the substrate 11 helps to suppress the warpage of the substrate 11 even after the removal of the glass support member 17 in the manufacturing process. For example, the substrate 11 and the magnetic support member 15 may be fixed on the substrate holder 18 generating a magnetic field so as to be stretched over the substrate holder 18. This allows the substrate 11 to be easily handled and achieves a stable manufacturing yield of the display device 1.

In some example embodiments of the technology, the substrate 11 and the magnetic support member 15 including a magnetic material may be fixed on the substrate holder 18 during the manufacturing of the display device 1. This helps to suppress the warpage of the substrate 11 and improve the manufacturing stability of the display device 1.

In some example embodiments of the technology, the magnetic support member 15 may serve as a heat-dissipative metal plate. In other words, the magnetic support member 15 may include a heat-dissipative metal plate. This helps to suppress the warpage of the substrate 11 without the need for an additional member.

[Exemplary Configuration of Display Device]

Figure 6:
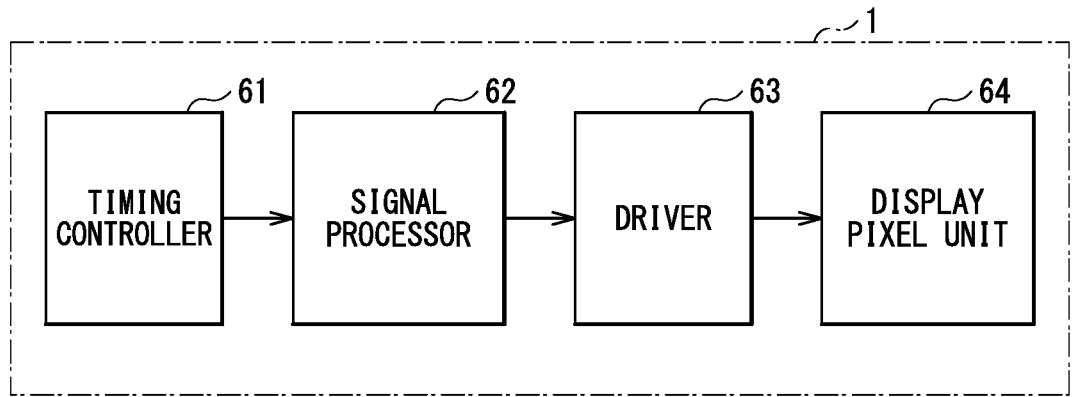
FIG. 6 is a block diagram illustrating an exemplary configuration of a display device according to one example embodiment of the technology.

FIG. 6 is a block diagram illustrating an exemplary configuration of the display device 1 which is described with reference to the example embodiments described above.

The display device 1 may display images based on signals generated inside the display device 1 or received from an external device. The display device 1 may be applied to a quantum dot (QD) display and an inorganic electroluminescent display as well as the organic electroluminescent display described above. The display device 1 may include a timing controller 61, a signal processor 62, a driver 63, and a display pixel unit 64, for example.

The timing controller 61 may include a timing generator that generates various timing signals (control signals). The timing controller 61 may drive the signal processor 62 and other components on the basis of the various timing signals. The signal processor 62 may perform a predetermined correction of digital image signals received from an external device, for example, and may output the corrected image signals to the driver 63. The driver 63 may include a scanning line driving circuit and a signal line driving circuit, for example. The driver 63 may drive the pixels in the display pixel unit 64 via the various control lines. The display pixel unit 64 may include display elements such as organic electroluminescent elements (e.g., the display device layer 20 described above) and pixel circuits that drives the respective display elements. For example, The TFT 10a described above may be used in various circuits constituting part of the driver 63 or the display pixel unit 64.

[Example Imaging Apparatus]

Figure 7:
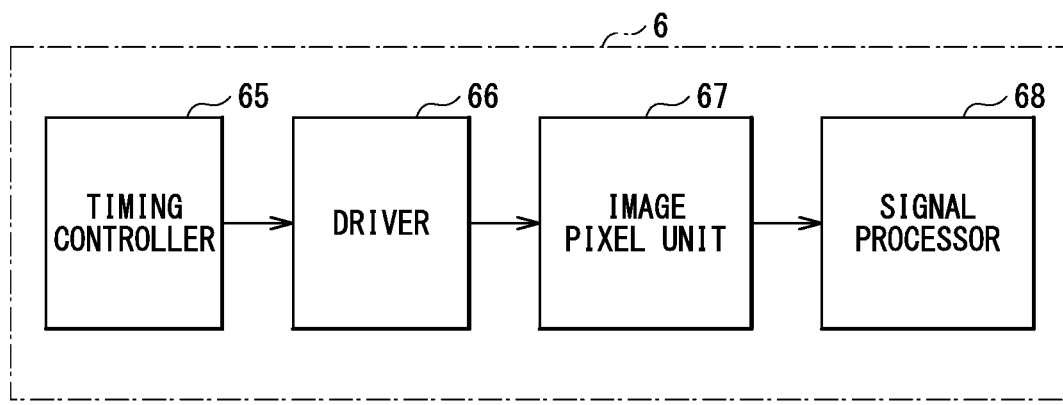
FIG. 7 is a block diagram illustrating an exemplary configuration of an imaging apparatus according to one example embodiment of the technology.

In the example embodiments described above, the semiconductor device 10 is applied to the display device 1. The semiconductor device 10 may also be applied to an imaging apparatus 6 illustrated in FIG. 7 as well as the display device 1.

The imaging apparatus 6 may be a solid-state imaging apparatus that acquires an image in the form of electrical signals. For example, the imaging apparatus 6 may be a charge coupled device (CCD) image sensor or a complementary metal oxide semiconductor (CMOS) image sensor. The imaging apparatus 6 may include a timing controller 65, a driver 66, an image pixel unit 67, and a signal processor 68, for example.

The timing controller 65 may include a timing generator that generates various timing signals (control signals). The timing controller 65 may drive the driver 66 on the basis the various timing signals. The driver 66 may include a row selection circuit, an AD converting circuit, and a horizontal transfer scanning circuit, for example. The driver 66 may read a signal from each pixel in the image pixel unit 67 through the various control lines. The image pixel unit 67 may include an imaging element (photoelectric transducer) such as a photodiode, and a pixel circuit that reads signals. The signal processor 68 may perform various signal processes on the signals received from the image pixel unit 67. For example, various circuits constituting part of the driver 66 or the image pixel unit 67 may include the TFT 10a described above.

[Example Electronic Apparatus]

Figure 8:
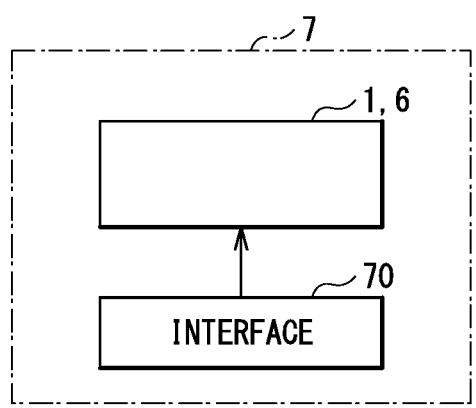
FIG. 8 is a block diagram illustrating an exemplary configuration of an electronic apparatus according to one example embodiment of the technology.

The display device 1 or the imaging apparatus 6 described with reference to the example embodiments described above may be applied to various electronic apparatuses. FIG. 8 is a block diagram illustrating an exemplary configuration of an electronic apparatus 7. Examples of the electronic apparatus 7 may include a television unit, a personal computer (PC), a smartphone, a tablet PC, a mobile phone, a digital still camera, and a digital video camera.

The electronic apparatus 7 may include the display device 1 or the imaging apparatus 6, and an interface 70, for example. The interface 70 may be an input unit that receives various signals and electric power from external devices. Optionally, the interface 70 may include a user interface, such as a touch panel, a keyboard, or operation buttons.

Note that the example embodiments of the technology described above are non-limiting and various modifications may be made. For example, the material and the thickness of each layer described in the example embodiments described above are non-limiting examples, and each layer described in the example embodiments described above may include another material or may have another thickness.

Figure 9:
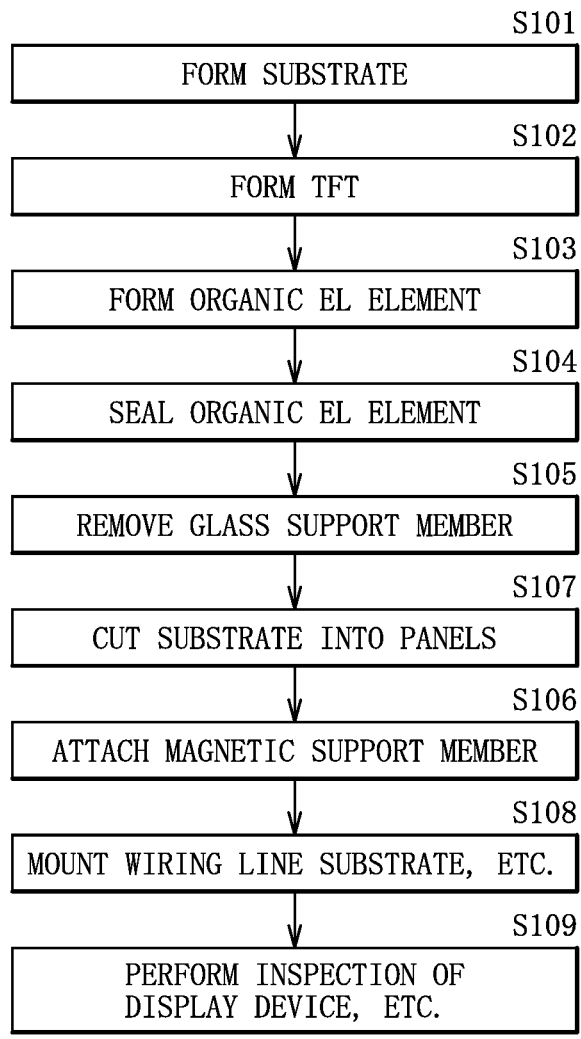
FIG. 9 is a flowchart illustrating another example of the method of manufacturing the display device illustrated in FIG. 4.

The order of the processes of manufacturing the display device 1 illustrated in FIG. 4 is a mere example. In another example embodiment, the display device 1 may be manufactured through other processes. For example, as illustrated in FIG. 9, the process of attaching the magnetic support member (Step S106) may be performed after the process of cutting the substrate (Step S107).

In some example embodiments of the technology, the organic electroluminescent element 20A may be described as an example self-luminescent element. However, the display device 1 may be a QD display or an inorganic electroluminescent display rather than the organic electroluminescent element 20A, for example.

In some example embodiments of the technology, the TFT 10a may have a top-gate structure. However, the example embodiments of the technology may be applied to a semiconductor device having a bottom-gate structure.

In some example embodiments of the technology, the TFT 10a may serve as the driving transistor DsTr. However, the TFT 10a may serve as another component.

It should be appreciated that the effects described herein are mere examples. Effects of the example embodiments, modification examples, and application examples of the technology are not limited to those described herein, and may be different from those described herein. The technology may further include any effects other than those described herein.

Furthermore, the technology encompasses any possible combination of some or all of the various embodiments and the modifications described herein and incorporated herein.

In at least one example embodiment of the technology, the display device includes the support member including a magnetic material. The support member and the flexible substrate are drawn by a magnetic field.

According to the method of manufacturing the display device according to at least one example embodiment of the technology, the second support member including a magnetic material is attached to the flexible substrate after removing the first support member. The flexible substrate, together with the second support member, may be drawn by a magnetic field generated by the substrate holder, for example. This helps to fix the flexible substrate and the second support member to the substrate holder.

According to the display device and the method of manufacturing the display device according to at least one example embodiment of the technology, the second support member includes a magnetic material. This helps to fix the flexible substrate and the second support member to the substrate holder. Therefore, it is possible to provide a display device having a flexible substrate resistant to warpage and thus having higher manufacturing stability. It is to be noted that effects of the example embodiments, modification examples, and application examples of the technology should not be limited to those described hereinabove, and may be any effect described herein.

Although the technology is described hereinabove in terms of example embodiments, modification examples, and application examples, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:

1. A method of manufacturing a display device, the method comprising:
    attaching a first support member to a second face of a flexible substrate;
    forming a self-luminescent element on a first face of the flexible substrate, the first face being opposed to the second face of the flexible substrate to which the first support member is attached;
    removing the first support member from the flexible substrate after the forming of the self-luminescent element; and attaching a second support member to the second face of the flexible substrate after the removing of the first support member, the second support member including a magnetic material.

2. The method according to claim 1, further comprising:
holding the flexible substrate to which the second support member is attached on a substrate holder configured to generate a magnetic field, the second support member being positioned between the flexible substrate and the substrate holder while the flexible substrate is held on the substrate holder.

3. The method according to claim 1,
wherein the first support member to be attached to the second face of the flexible substrate includes glass.

4. The method according to claim 1,
wherein the flexible substrate includes polyimide.

5. The method according to claim 1,
wherein the magnetic material comprises ferrite-based stainless steel or martensite-based stainless steel.

6. The method according to claim 1,
wherein the second support member includes a metal material.

7. The method according to claim 1,
wherein the second support member comprises a metal plate.

8. The method according to claim 1,
wherein the second support member has a thickness in a range from about 5 micrometers to about 150 micrometers.

9. The method according to claim 1,
wherein the attaching the second support member comprises attaching the second support member to the second face of the flexible substrate so as to entirely extend over the second face.

10. The method according to claim 1,
wherein the attaching the second support member comprises attaching the second support member at least along an end of the second face of the flexible substrate.

11. The method according to claim 1,
wherein the removing the first support member from the flexible substrate comprises performing laser irradiation.

12. The method according to claim 1,
wherein the self-luminescent element comprises an organic electroluminescent element.

13. The method according to claim 2,
wherein the substrate holder comprises a tray to be carried between processes or a mounting stage, and
a face of the substrate holder on which the second support member is to be fixed is substantially flat.

14. The method according to claim 2,
wherein the substrate holder includes stainless steel.

15. The method according to claim 2, further comprising:
performing an inspection with the flexible substrate being held by the substrate holder, the inspection comprising an inspection of a display state of the self-luminescent element.

* * * * *